United States Patent [19]

Liang et al.

[11] Patent Number: 5,444,283
[45] Date of Patent: Aug. 22, 1995

[54] DOPANT-DIFFUSION BUFFERED BURIED CONTACT MODULE FOR INTEGRATED CIRCUITS

[75] Inventors: Mong-Song Liang, Cupertino; Cheng C. Hu, San Jose; Ting-Wah Wong, Cupertino, all of Calif.

[73] Assignee: Mosel Vitelic Corporation, San Jose, Calif.

[21] Appl. No.: 67,409

[22] Filed: May 25, 1993

Related U.S. Application Data

[63] Continuation of Ser. No. 809,773, Dec. 17, 1991, abandoned.

[51] Int. Cl.⁶ .................. H01L 29/80; H01L 29/06
[52] U.S. Cl. ..................... 257/361; 257/362
[58] Field of Search .............. 357/45, 41, 23.11;
257/360, 361, 300, 302, 309, 303, 305, 313, 296, 382, 387, 395, 431, 350, 369, 408, 534, 622, 903, 904, 360, 361, 362, 368

[56] References Cited

U.S. PATENT DOCUMENTS

| 4,095,251 | 6/1978 | Dennard et al. | 357/45 |
| 4,941,028 | 7/1990 | Chen et al. | 257/360 |

Primary Examiner—Sara W. Crane
Assistant Examiner—Carl Whitehead, Jr.
Attorney, Agent, or Firm—Skjerven, Morrill, MacPherson, Franklin & Friel; Norman R. Klivans

[57] ABSTRACT

A buried contact module is provided that includes a dopant-diffusion buffer layer. The dopant-diffusion buffer layer is formed with a thin dielectric region fabricated between the polysilicon contact region and the well region. The dielectric region formed of, for example, silicon dioxide, limits the amount of phosphorous diffusion into the well region. Thus, a buried contact junction can be formed in an integrated circuit having a high punch-through voltage characteristic, a low junction leakage current characteristic and a low polysilicon resistance. In addition, the buried contact junction maintains a relatively low buried contact resistance.

10 Claims, 10 Drawing Sheets

DOPANT-DIFFUSION BUFFERED BURIED CONTACT MODULE FOR INTEGRATED CIRCUITS

This application is a continuation division of application Ser. No. 07/809,773 filed Dec. 17, 1991, now abandoned.

BACKGROUND OF THE INVENTION

1. Field of the Invention

This invention relates to integrated circuits and more particularly to buried contact modules that form contact junctions within integrated circuits.

2. Description of the Relevant Art

Buried contact modules for forming contact junctions are well-known in integrated circuit technology. A conventional process for fabricating a buried contact module involves the use of polysilicon to directly contact a diffusion region of an N-type or a P-type well that is formed on, for example, a silicon substrate.

Several problems are associated with contact junctions formed with buried contact modules. In general, it is desirable to fabricate a contact junction having a low resistivity. Low polysilicon resistivity is particularly desirable for high speed applications. To achieve this low contact resistivity, the polysilicon portion of the buried contact module is heavily doped with either an N-type or a P-type material. However, such a high dopant concentration in the polysilicon region can result in an unacceptably deep junction depth. As a result, a phenomenon known as device punch-through occurs, as explained in more detail below.

The problems associated with buried contact modules will be better understood with reference to FIG. 1. FIG. 1 illustrates a pair of contact junctions formed by two separate buried contact modules. A first buried contact module is fabricated with a polysilicon region 10 and a P-type well region 12. A second buried contact module is fabricated with another polysilicon region 14 and the P-type well region 12. A field oxide region 16 provides isolation between the contact junctions formed by the two buried contact modules. Polysilicon regions 10 and 14 are connected to separate metal conductors 18 and 20, respectively, that connect to, for example, external pins of the integrated circuit. The buried contact modules illustrated in FIG. 1 are shown in combination with an N-type substrate region 22 on which the P-type well region 12 is formed. FIG. 1 also illustrates a pair of gate dielectric regions 24 and 25 and a pair of gate regions 26 and 27.

Each of the polysilicon regions 10 and 14 are heavily doped by phosphorous ion implantation or doped by $POCl_3$ source. The polysilicon regions 10 and 14 thus have an N-type conductivity. As a result of this N+ type dopant, phosphorous ions diffuse into the P-type well region 12 from each polysilicon region 10 and 14 and thereby form active areas which allow electrical conduction to, for example, a source or a drain region (not shown) formed in the P-type well region 12. The higher the concentration of phosphorous implantation in the polysilicon regions 10 and 14, the deeper the active area defined by the diffused phosphorous ions in the P-type well region 12. The depth of the phosphorous diffusion into the well region 12 is known as the buried contact junction depth $X_j$. As shown in FIG. 1, $X_{j1}$ illustrates the junction depth of the buried contact modules wherein a relatively low concentration of dopant is provided in the polysilicon regions 10 and 14, while $X_{j2}$ illustrates the junction depths wherein a relatively high concentration of dopant is provided in the polysilicon region 10 and 14.

As illustrated by the merging arrows a and b of FIG. 1, when the dopant concentration of the polysilicon regions 10 and 14 is increased, the active areas of the respective buried contact modules become closer together. If the active areas become too close, the field oxide region 16 does not provide isolation between the contact junctions when a voltage differential is applied between terminals V1 and V2. When this occurs, the punch-through phenomenon occurs wherein current is allowed to flow between the active areas of the buried contact junctions.

Therefore, to avoid the punch-through phenomenon, the integrated circuit must be operated under limited conditions to assure that the voltage differential between contact junctions does not reach the breakdown level. Furthermore, compromises must be made by the designer of the device in consideration of interconnect polysilicon resistance, contact resistance, punch-through voltage and junction leakage current.

SUMMARY OF THE INVENTION

In accordance with the present invention, a buried contact module is provided that includes a dopant-diffusion buffer layer. The dopant-diffusion buffer layer is formed with a thin dielectric region fabricated between the polysilicon contact region and the well region. The dielectric region formed of, for example, silicon dioxide, limits the amount of phosphorous diffusion into the well region. Thus, a buried contact junction can be formed in an integrated circuit having a high punch-through voltage characteristic and a low junction leakage current characteristic. In addition, a buried contact junction in accordance with the present invention maintains a relatively low buried contact resistance.

These and other advantages are achieved by the present invention, in accordance with which a buried contact module for an integrated circuit comprises a well region formed on a semiconductor substrate, a polysilicon layer, and a dielectric layer formed between the well region and the polysilicon layer.

The invention will be more readily understood with reference to the drawings and the detailed description. As will be appreciated by one skilled in the art, the invention is applicable to buried contact modules in general and is not limited to the specific embodiment disclosed.

DETAILED DESCRIPTION

The following includes a detailed description of the best presently contemplated mode for carrying out the invention. The description is intended to be merely illustrative of the invention and should not be taken in a limiting sense.

Figure 1:
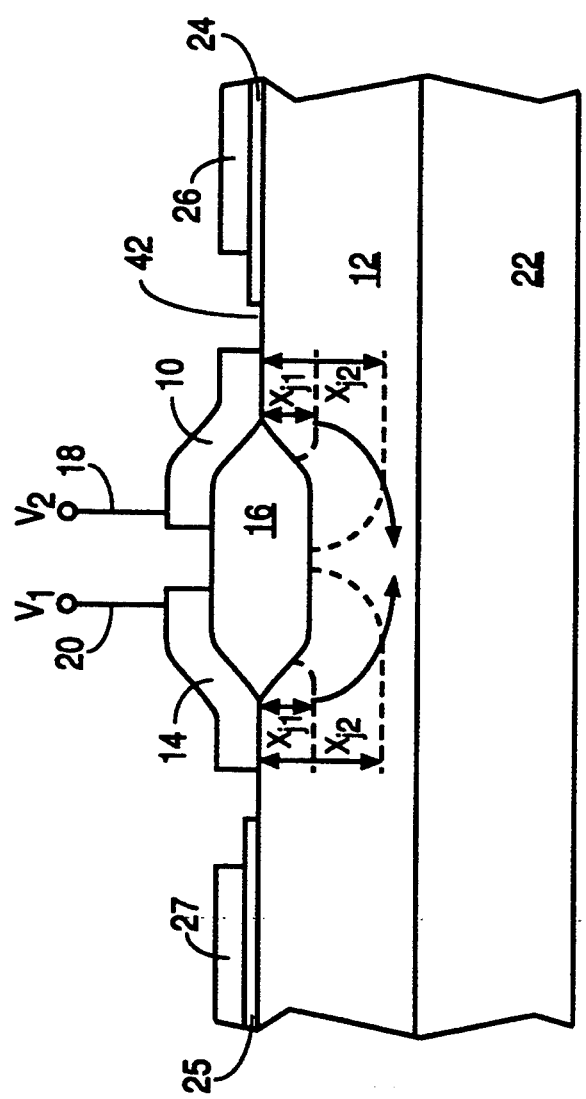
FIG. 1 is a diagram of a cross-sectional portion of an integrated circuit incorporating conventional buried contact modules.
Figure 2A:
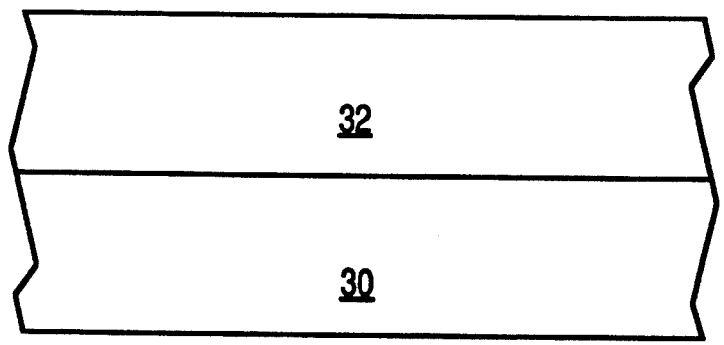
FIGS. 2A-2K are diagrams illustrating the processing steps associated with the formation of a dopant-diffusion buffered buried contact module in accordance with one embodiment of the present invention.
Figure 2B:
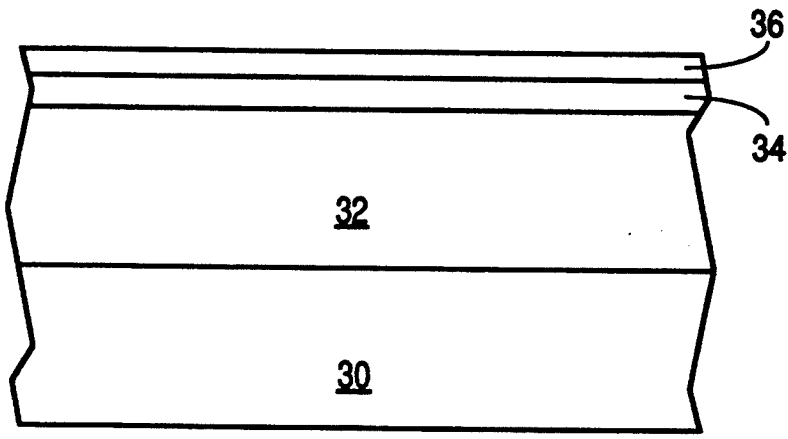
Figure 2C:
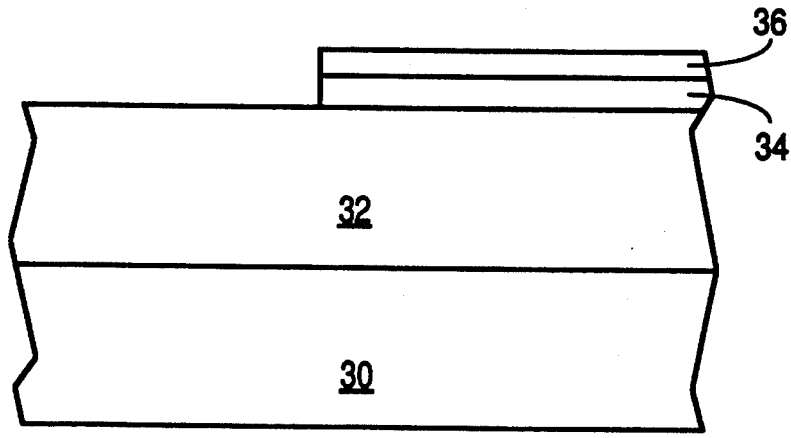
Figure 2D:
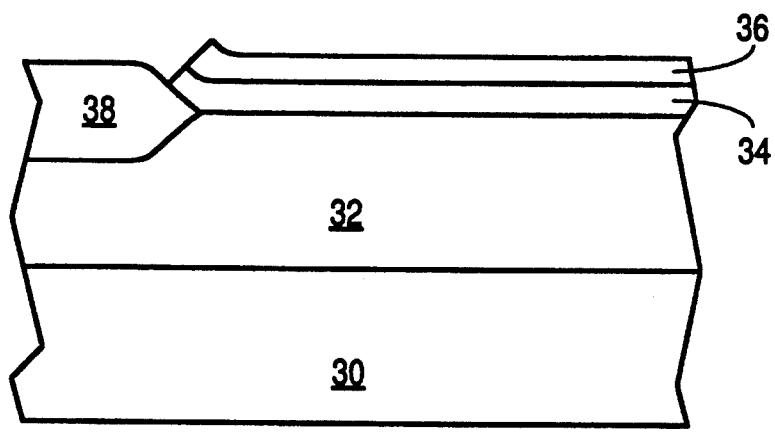
Figure 2E:
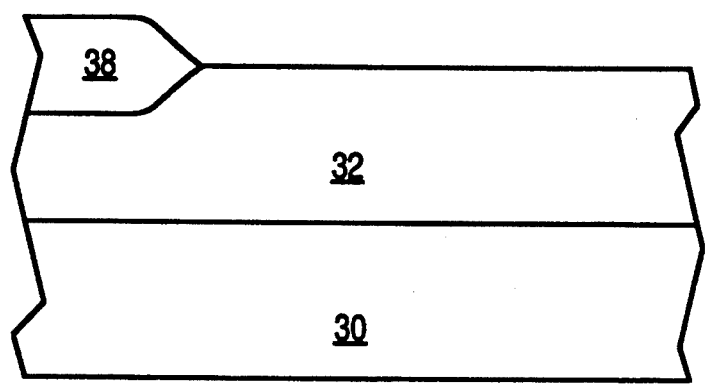
Figure 2F:
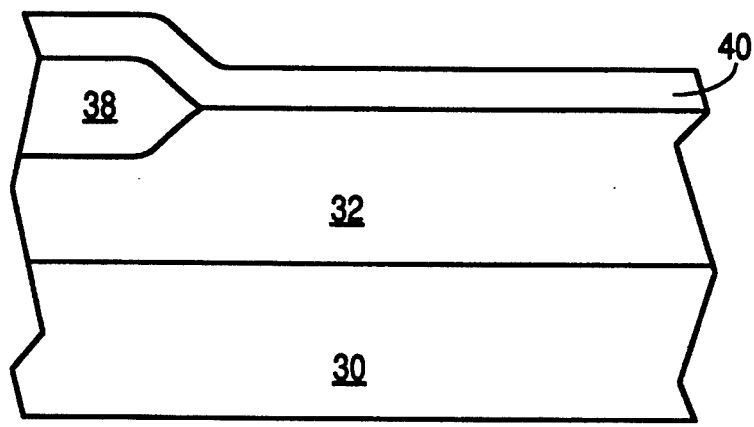
Figure 2G:
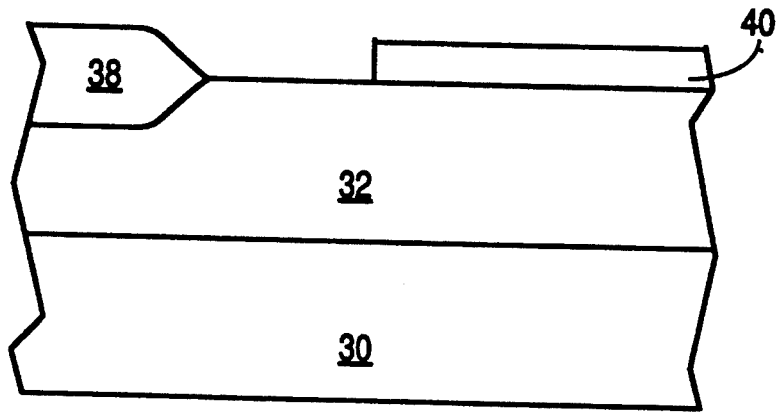

A dopant-diffusion buffered buried contact module in accordance with the preferred embodiment of the present invention is next explained in conjunction with FIGS. 2A-2K. FIGS. 2A-2K illustrate the processing steps associated with the fabrication of the buried contact module. A P-type well region 32 is first formed on an N-type silicon substrate region 30 as illustrated in FIG. 2A. Next, as illustrated in FIG. 2B, a pad oxide layer 34 is grown on the well region 32, and a nitride layer 36 is thereafter formed on the pad oxide layer 34. FIG. 2C illustrates the results of a masking step wherein a portion of the pad oxide layer 34 and the nitride layer 36 is etched to expose a portion of the well region 32. The remaining portions of the pad oxide layer 34 and the nitride layer 36 serves as a mask to prevent the oxidation of the underlying portion of the well region 32 during an oxidation step as illustrated in FIG. 2D. As shown in FIG. 2D, oxidation of the exposed portion of the well region 32 has occurred, thereby forming a field oxide region 38. The remaining portions of the pad oxide layer 34 and the nitride layer 36 are thereafter removed as shown in FIG. 2E by conventional methods. A thin gate oxide layer 40 is next grown on the exposed well region 32 as illustrated in FIG. 2F, and a portion thereof is removed as shown in FIG. 2G.

Figure 2H:
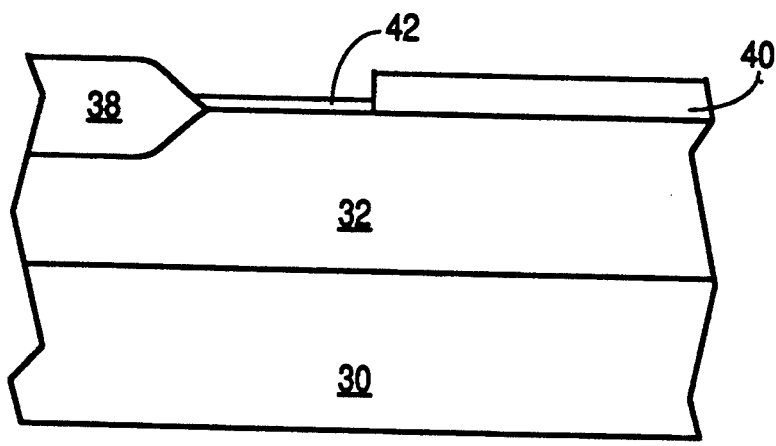
Figure 2I:
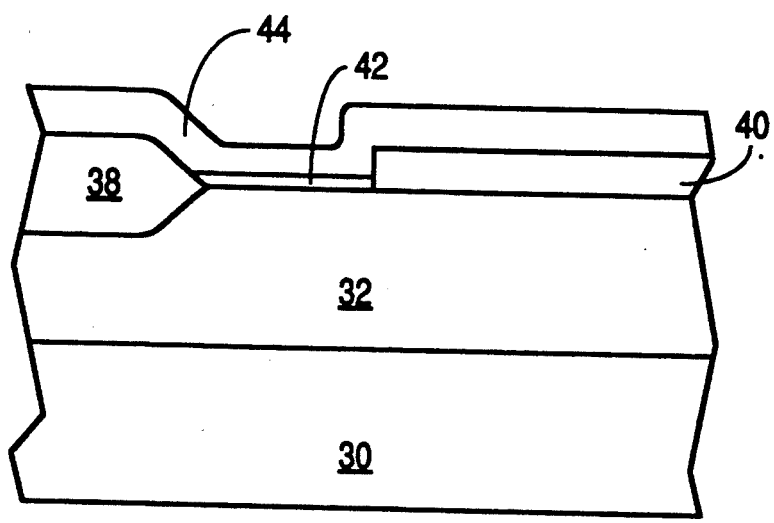
Figure 2J:
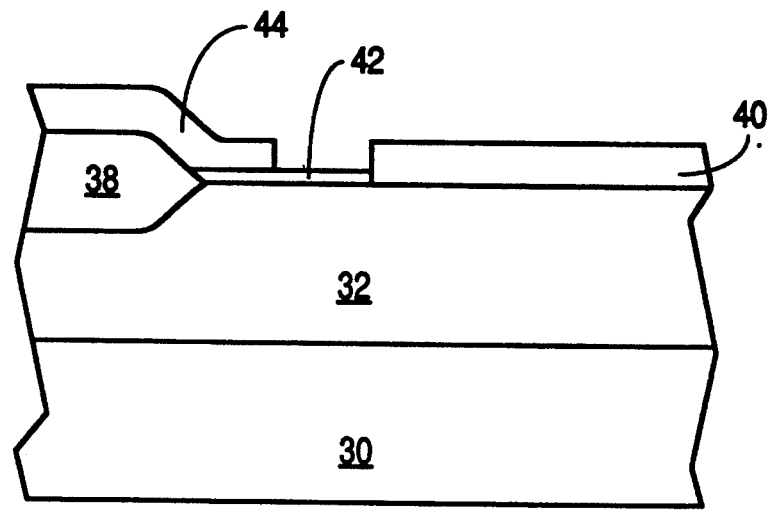
Figure 2K:
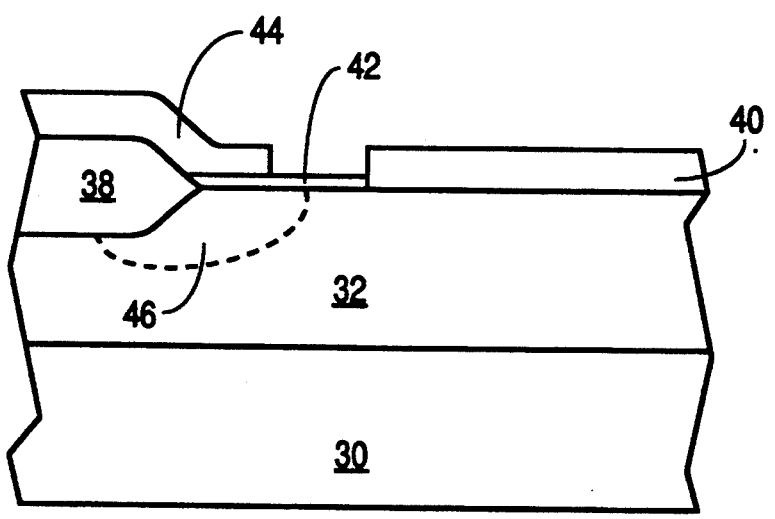

In accordance with the invention, a thin dielectric growth 42 is next grown on the exposed portion of the well region 32 as illustrated in FIG. 2H. A polysilicon layer 44 is next deposited on the entire outer surface as illustrated in FIG. 2I. The polysilicon layer 44 is heavily doped by phosphorous ion implantation or doped by POCl₃ source. As illustrated in FIG. 2J, a masking and etching step is next performed to etch a portion of the polysilicon layer 44. The remaining portion of the polysilicon layer 44 forms the polysilicon contact. Finally, a thermal anodizing step is performed as illustrated in FIG. 2K that results in a diffusion of phosphorous ions from the polysilicon layer 44 into the well region 32. Thus, a portion of the well region 32 forms an N-type active area 46 that establishes the buried contact junction.

It is noted that the thin dielectric growth 42 comprising silicon dioxide is in the preferred embodiment approximately 30 to 100 Å thick. In contrast, the gate oxide layer 40 in the preferred embodiment is approximately 175 to 200 Å thick.

The resulting buried contact module structure including a thin dielectric growth 42 as shown in FIG. 2K results in several dramatic advantages over conventional buried contact modules. These advantages will next be explained in conjunction with FIGS. 3-7.

Figure 3:
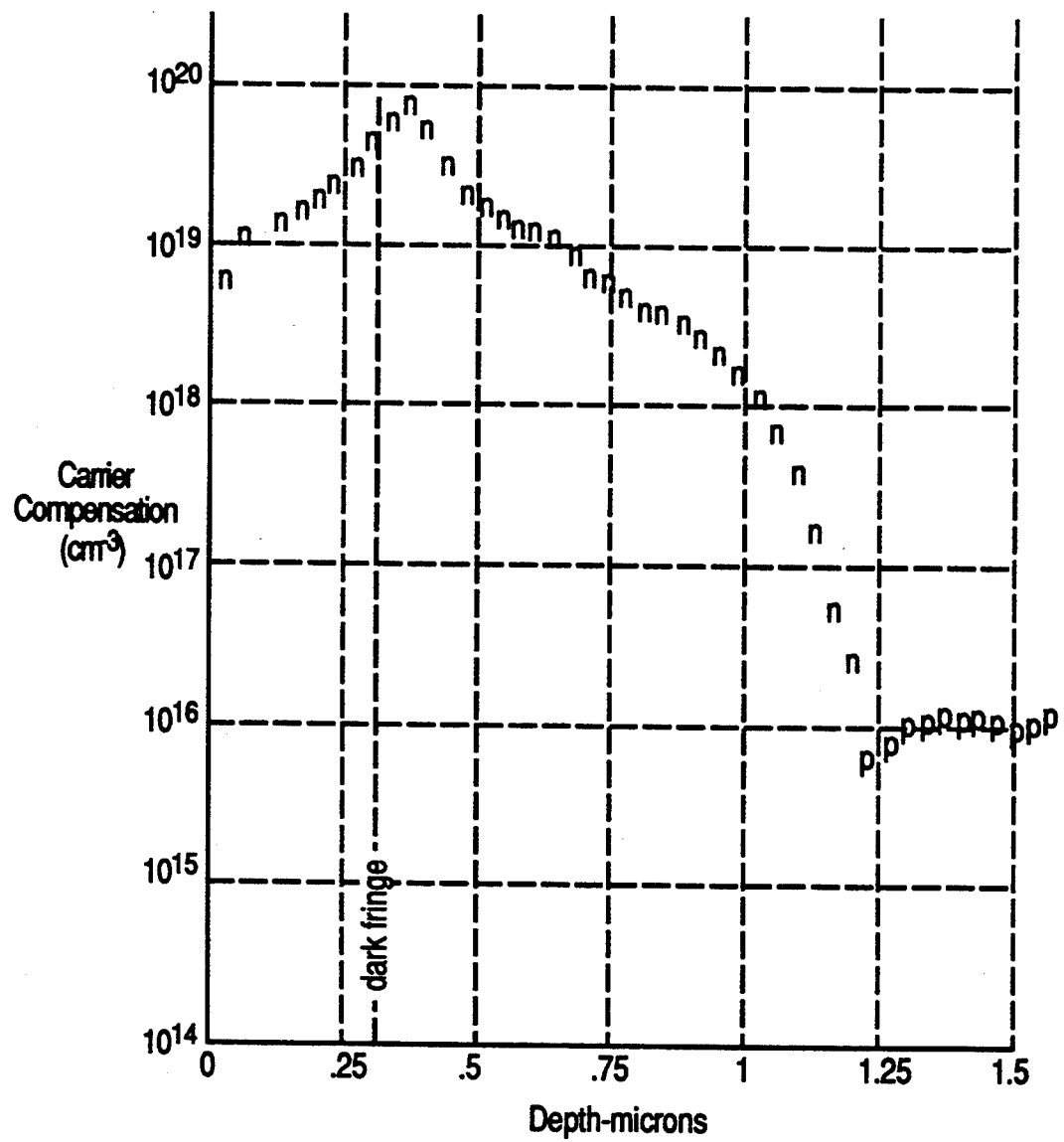
FIG. 3 shows a graph of a spreading resistance profile for a conventional buried contact module.
Figure 4:
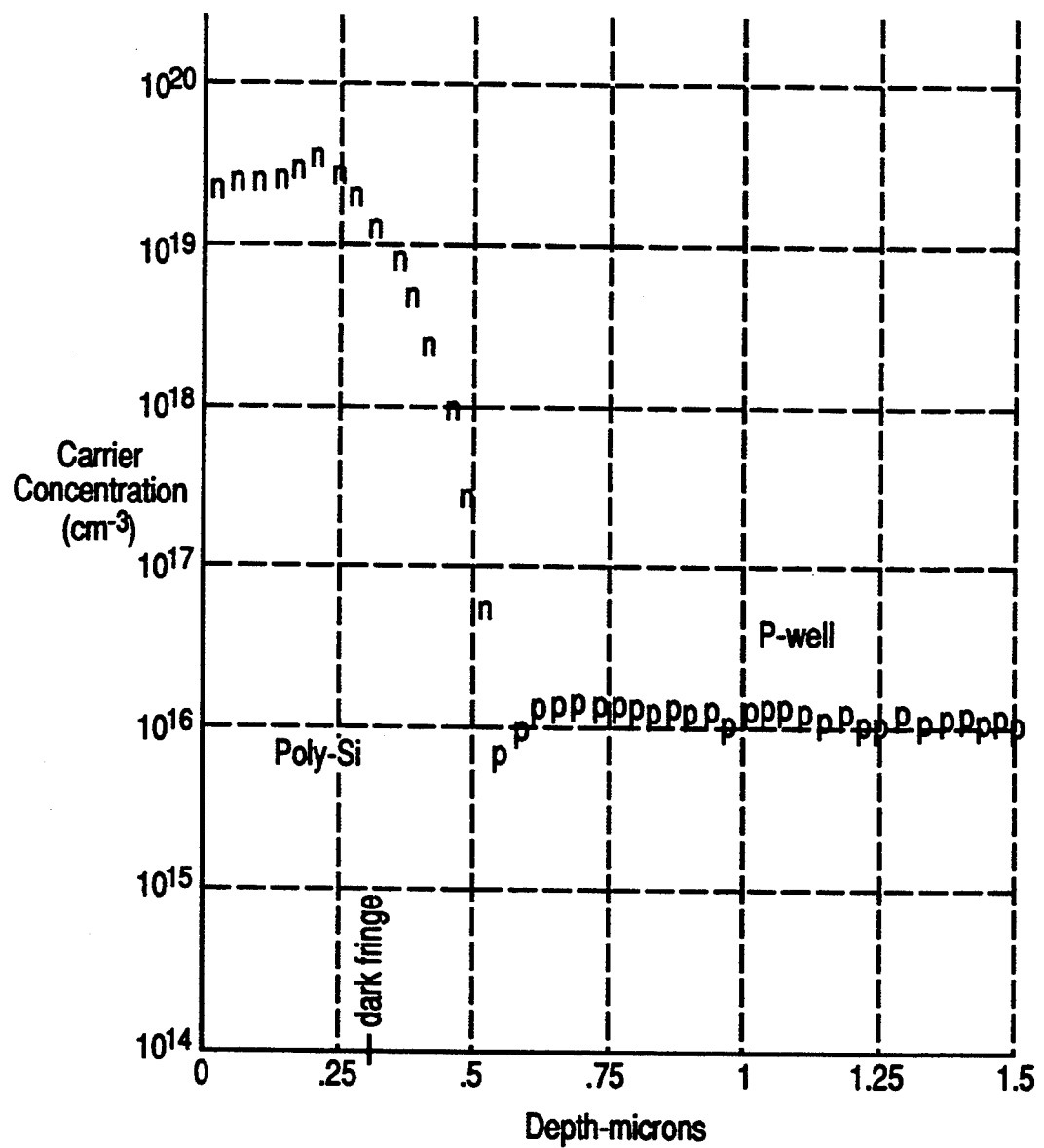
FIG. 4 shows the spreading resistance profile for a buried contact module having a structure in accordance with the present invention.

As illustrated in FIGS. 3 and 4, a structure in accordance with the present invention has an associated smaller junction depth in comparison with a conventional buried contact module. FIG. 3 shows a graph of a spreading resistance profile for a conventional buried contact module. The chart illustrates the carrier concentration vs. depth in the integrated circuit. The dark fringe location which indicates the location of the interface between the polysilicon layer 44 and the well region 32 is at approximately 0.28 microns in depth. As shown at a depth of approximately 1.2 microns, the N carrier concentration diminishes, thereby indicating the total depth of the active region 46. From this, it is evident that the resulting junction depth $X_J$ is approximately 0.9 microns.

In comparison, referring to the chart of FIG. 4 showing the spreading resistance profile for a buried contact module having a structure in accordance with the present invention, the overall junction depth $X_J$ is approximately 0.25 microns. The dopant concentration of the buried contact module resulting in the profile of FIG. 4 is approximately equal to the dopant concentration of the conventional buried contact module resulting in the spreading resistance profile of FIG. 3. Thus, it is evident that the junction depth for a device in accordance with the present invention is less than that associated with a conventional device having the same dopant concentration.

Figure 5:
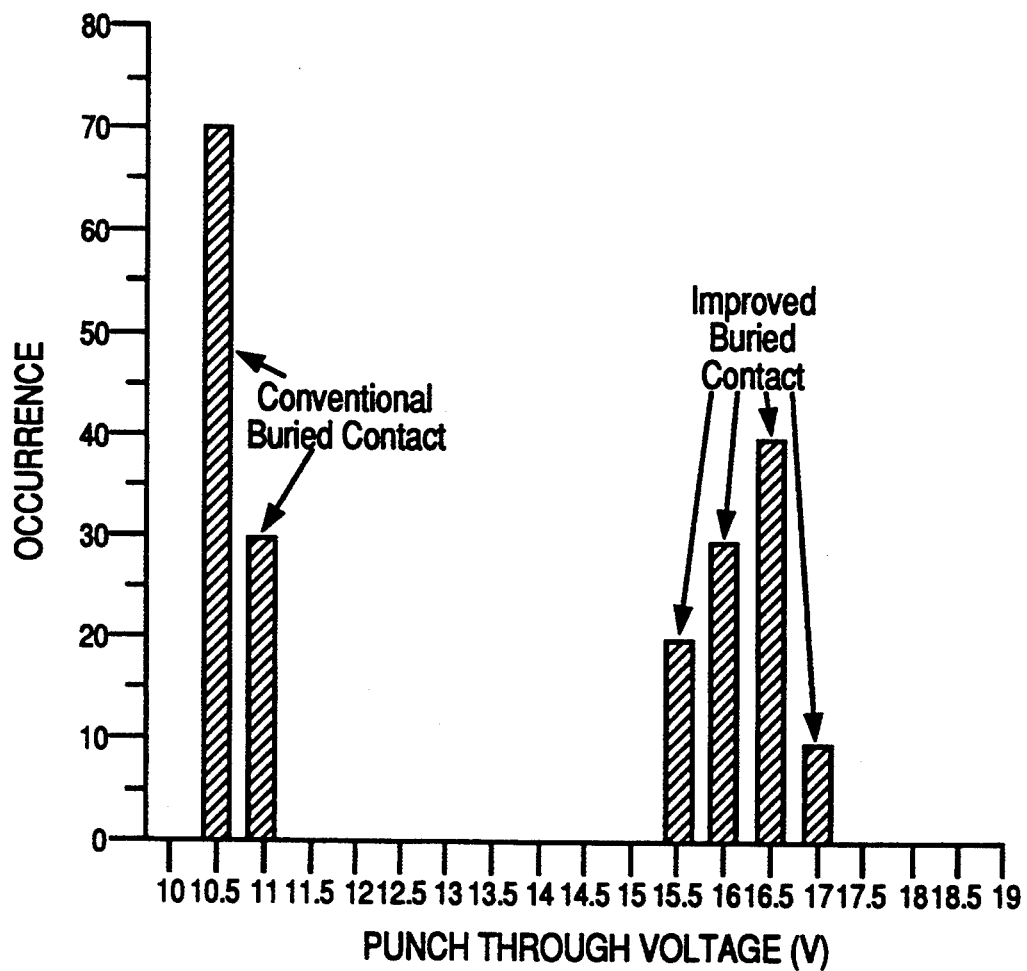
FIG. 5 shows a comparative chart illustrating the typical punch-through voltage associated with a conventional buried junction module and a punch-through voltage associated with a buried junction module fabricated in accordance with the present invention.

FIG. 5 shows a comparative chart illustrating the typical punch-through voltage associated with a conventional buried junction module and the punch-through voltage associated with a buried junction module fabricated in accordance with the present invention. As this graph illustrates, a typical punch-through voltage for a conventional buried junction module is approximately 11 volts, while the punch-through voltage for a buried junction module in accordance with the invention is approximately 17.5 volts. Thus, an improvement of approximately 6.5 volts in punch-through voltage is demonstrated by the present invention.

Figure 6:
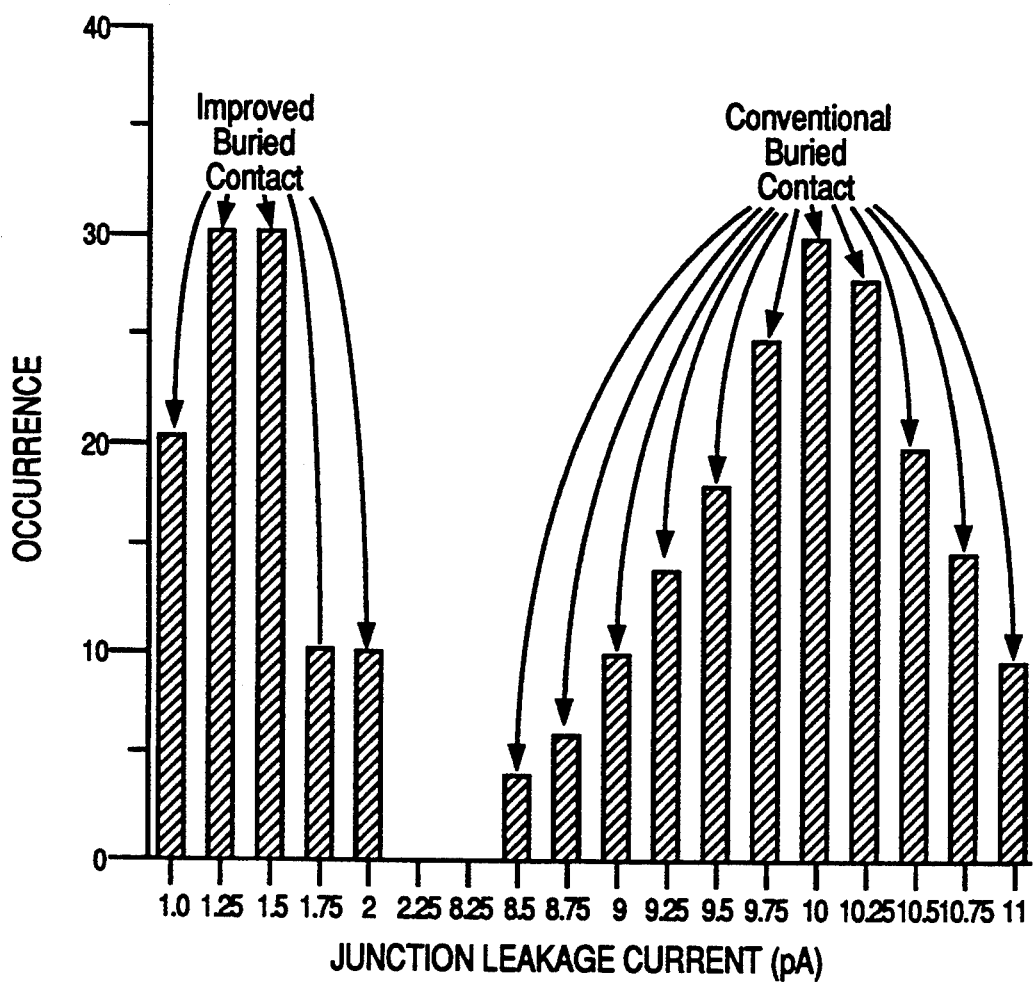
FIG. 6 shows a comparative graph of the junction leakage current for a conventional buried contact module and for the buried contact module in accordance with the invention.

FIG. 6 shows a comparative graph of the junction leakage current for a conventional buried contact module and for the buried contact module in accordance with the invention. As illustrated, the conventional junction leakage current is approximately 10 picoamps, while the junction leakage current for a buried contact module in accordance with the present invention is only approximately 1.4 picoamps. This reduction in junction leakage current is particularly advantageous in that the buried contact modules of the present invention can be applied to SRAM (static random access memory) applications wherein even a slight leakage current creates severe degradation in performance.

Figure 7:
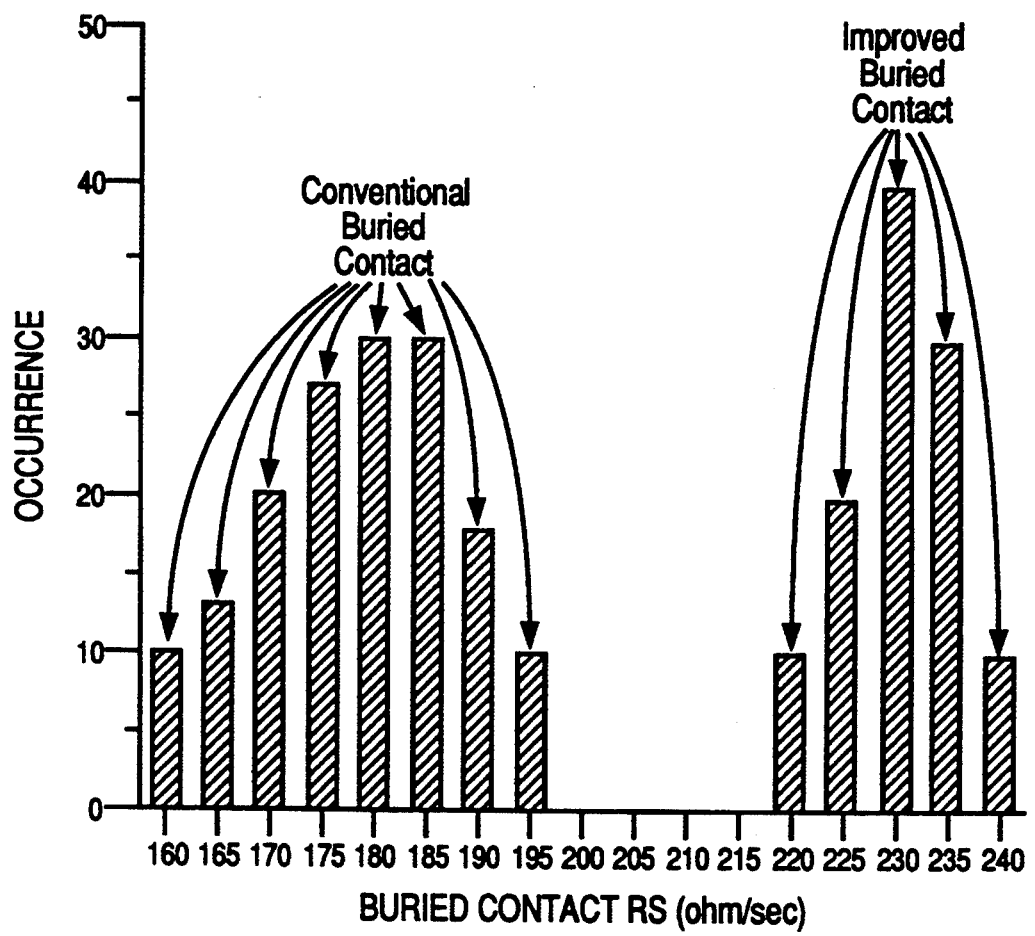
FIG. 7 shows a comparative graph of the buried contact chain resistance for both a conventional buried contact module and for a buried contact module in accordance with the present invention.

Finally, FIG. 7 shows a comparative graph of the buried contact chain resistance for both a conventional buried contact module and for a buried contact module in accordance with the present invention. Although the buried contact resistance of the conventional buried contact module is approximately 180 ohms per section while that of the buried contact module in accordance with the invention is approximately 310 ohms per section, this higher resistance associated with the structure of the present invention does not create a noticeable increase in voltage drop across the contact. That is, since a typical operating current for an SRAM device is approximately 200 μA, the voltage drop across the contact of a conventional contact module and the voltage drop across a contact module in accordance with the present invention is negligible in either case.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined with reference to the following claims.

We claim:

1. A transistor having a buried contact module, the transistor comprising:
   a well region formed on a semiconductor substrate;
   a polysilicon layer;
   an active area formed within said well region and being defined by an area of ions distributed in said well region such that a contact junction is provided from any portion of said active area to said polysilicon layer; and
   a dopant-diffusion buffer layer formed between said active area and said polysilicon layer, wherein said dopant-diffusion buffer layer is an electrically conductive part of said buried contact module for electrically connecting said active area to said polysilicon layer, wherein said dopant-diffusion buffer layer is between 30 and 100 Å thick.

2. The transistor of claim 1 further comprising a field oxide region formed between said well region and a portion of said polysilicon layer and formed adjacent to said dopant-diffusion buffer layer.

3. The transistor of claim 1 wherein said polysilicon layer is doped by phosphorous ion implantation.

4. The transistor of claim 1 wherein said polysilicon layer is doped by a POCl$_3$ source.

5. The transistor of claim 1 wherein said polysilicon layer has an N-type conductivity.

6. The transistor of claim 1 wherein said polysilicon layer is electrically connected to a conductor.

7. The transistor of claim 1 wherein said ions distributed in said well region are diffused from said polysilicon layer.

8. The transistor of claim 1 wherein said dopant-diffusion buffer layer is a dielectric.

9. A transistor having a buried contact module, comprising:
   a semiconductor substrate having a doped region and a principal surface;
   said doped region in said substrate extending to said principal surface;
   a conductive polysilicon layer overlying said principal surface; and
   a thin dopant-diffusion buffer layer on said principal surface, extending between and separating said polysilicon layer and said principal surface; wherein said buffer layer is a low resistance portion of said buried contact module for electrically connecting said polysilicon layer to said doped region, and wherein said buffer layer is between 30 and 100 Å thick.

10. A buried contact module for an integrated circuit, comprising:
    a well region formed in a semiconductor substrate;
    a polysilicon layer overlying the substrate;
    an active doped area formed within said well region and being defined by an area of ions distributed in said well region such that a contact junction is provided from any portion of said active doped area to said polysilicon layer; and
    an electrically conductive dopant-diffusion buffer layer between 30 and 100 Å thick formed between said active area and said polysilicon layer, wherein said dopant-diffusion buffer layer is a part of said buried contact module for electrically connecting said active doped area to said polysilicon layer;
    wherein a current is conductible through said dopant-diffusion buffer layer to said active area, without rupturing said dopant-diffusion buffer layer.

* * * * *